(12) United States Patent
Morini et al.

(10) Patent No.: US 11,916,544 B2
(45) Date of Patent: Feb. 27, 2024

(54) SHORT CIRCUIT DETECTION AND LIMITING CHANNEL CURRENT IN TRANSISTOR BEFORE TURN OFF IN SHORT CIRCUIT CONDITION

(71) Applicant: Infineon Technologies Austria AG, Villach (AT)

(72) Inventors: Sergio Morini, Pavia (IT); Andrea Lampredi, Leghorn (IT); Salviano Marino, Latronico (IT); Daniele Miatton, Carbonara al Ticino (IT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/683,804

(22) Filed: Mar. 1, 2022

(65) Prior Publication Data

US 2023/0283273 A1  Sep. 7, 2023

(51) Int. Cl.
*H03K 17/08* (2006.01)
*H02H 9/02* (2006.01)
*H02H 1/00* (2006.01)

(52) U.S. Cl.
CPC .......... *H03K 17/08* (2013.01); *H02H 1/0007* (2013.01); *H02H 9/02* (2013.01)

(58) Field of Classification Search
CPC ...... H02H 1/0007; H02H 3/08; H02H 3/0935; H02H 9/02; H03K 17/08; H03K 21/02; H03K 3/86; H03K 7/08
See application file for complete search history.

(56) References Cited

U.S. PATENT DOCUMENTS

| | | | |
|---|---|---|---|
| 11,405,032 B2 | 8/2022 | Bernardoni et al. | |
| 2014/0078629 A1* | 3/2014 | Cortigiani | H03K 17/24 |
| | | | 361/79 |
| 2017/0272068 A1 | 9/2017 | Liang et al. | |
| 2017/0317488 A1* | 11/2017 | Pydah | G06F 1/305 |
| 2020/0244265 A1* | 7/2020 | Paganini | H03K 19/018521 |
| 2021/0028614 A1* | 1/2021 | Sugiyama | H02H 3/08 |

FOREIGN PATENT DOCUMENTS

| | | |
|---|---|---|
| DE | 102019121795 A1 | 2/2021 |
| EP | 2712083 A1 | 3/2014 |

\* cited by examiner

*Primary Examiner* — Jared Fureman
*Assistant Examiner* — Nicolas Bellido
(74) *Attorney, Agent, or Firm* — Harrity & Harrity, LLP (57) ABSTRACT

A method for driving a power transistor includes comparing a measurement signal that is representative of a load current to a comparator threshold that corresponds to an overcurrent threshold; generating a first fault signal when the measurement signal exceeds the comparator threshold for a first time interval; generating a second fault signal when the measurement signal exceeds the comparator threshold for a second time interval that is greater than the first time interval; regulating a control voltage provided to the control terminal of the transistor to turn off the transistor in response to the second fault signal; and in response to the first fault signal, adjusting the control voltage to an adjusted voltage level in order to limit the load current to a reduced current level that is preconfigured to be greater than the overcurrent threshold. The adjusted voltage level is sufficient to maintain the power transistor in an on-state.

21 Claims, 2 Drawing Sheets

SHORT CIRCUIT DETECTION AND LIMITING CHANNEL CURRENT IN TRANSISTOR BEFORE TURN OFF IN SHORT CIRCUIT CONDITION

BACKGROUND

Drivers are dimensioned to ensure the current needed by an application in any conditions (including technology spread, temperature, and supply variations). To protect the driver from damages and overheating, often an overcurrent/short detection circuit is included. The system has to react by turning the power switch OFF in case the overcurrent threshold is reached.

Usually, a driver is composed by two complementary MOSFETs or double-diffused MOS (DMOS) transistors to drive an output pad connected to a load. The two complementary MOSFETs are complementary turned ON and OFF to avoid cross-conduction. Usually, the gate-source voltage Vgs of a MOSFET is driven down to 0V to turn off the MOSFET and is driven to a maximum value for the technology (e.g., 3.3V) to fully turn on the MOSFET. This last value is chosen to minimize the on-resistance Ron to likewise minimize the power dissipation.

In the case of real short with very low resistance and low inductance, it is known that process, temperature, and supply variations can induce flowing of a current significantly higher than the overcurrent threshold. In the event that a short circuit occurs (e.g., at the load or between the output pad and the load), the short circuit is detected by an overcurrent circuit and the MOSFET currently conducting current (i.e., the one turned on) is turned off after a deglitch filter interval used to avoid false triggering. A MOSFET has a maximum switching current it can handle without being permanently damaged in the event of being quickly turned off. This maximum switching current depends on the dimensions of the MOSFET. If the load current exceeds the maximum switching current at the time the driver turns off the MOSFET, the MOSFET can become permanently damaged.

Therefore, an improved system that reduces the load current flowing through a transistor before turn off in response to an overcurrent event may be desirable in order to avoid damaging the transistor.

SUMMARY

One or more embodiments provide a driver system configured to drive a load, the driver system including: a power transistor including a control terminal, the power transistor is configured to receive a control voltage at the control terminal and conduct a load current based on the control voltage; an overcurrent monitoring circuit configured to compare a measurement signal that is representative of the load current to a comparator threshold that corresponds to an overcurrent threshold, generate a first fault signal in response to the measurement signal exceeding the comparator threshold for a first time interval, and generate a second fault signal in response to the measurement signal exceeding the comparator threshold for a second time interval, wherein the second time interval is greater than the first time interval; a gate driver circuit coupled to the control terminal, the gate driver circuit configured to regulate the control voltage to drive the power transistor between switching states to control the load current, wherein the gate driver circuit is configured to regulate the control voltage to turn off the transistor in response to the overcurrent monitoring circuit generating the second fault signal; and a current limiting circuit connected to the control terminal of the power transistor, wherein, in response to the overcurrent monitoring circuit generating the first fault signal, the current limiting circuit is configured to adjust the control voltage to an adjusted voltage level in order to limit the load current to a reduced current level that is preconfigured to be greater than the overcurrent threshold, wherein the adjusted voltage level is sufficient to maintain the power transistor in an on-state.

One or more embodiments provide a method of driving a power transistor to drive a load, the power transistor includes a control terminal and is configured to receive a control voltage at the control terminal and conduct a load current based on the control voltage, the method including: comparing, by an overcurrent monitoring circuit, a measurement signal that is representative of the load current to a comparator threshold that corresponds to an overcurrent threshold; generating, by an overcurrent monitoring circuit, a first fault signal in response to the measurement signal exceeding the comparator threshold for a first time interval; generating, by an overcurrent monitoring circuit, a second fault signal in response to the measurement signal exceeding the comparator threshold for a second time interval, wherein the second time interval is greater than the first time interval; regulating, by a gate driver circuit, the control voltage to drive the power transistor between switching states to control the load current, including regulating the control voltage to turn off the transistor in response to the overcurrent monitoring circuit generating the second fault signal; and in response to the overcurrent monitoring circuit generating the first fault signal, adjusting, by a current limiting circuit, the control voltage to an adjusted voltage level in order to limit the load current to a reduced current level that is preconfigured to be greater than the overcurrent threshold, wherein the adjusted voltage level is sufficient to maintain the power transistor in an on-state One or more embodiments provide a driver system configured to drive a load, the driver system including: a half bridge circuit including a high-side transistor and a low-side transistor, wherein the high-side transistor includes a first control terminal configured to receive a first control voltage conduct a load current flowing in a positive flow direction based on the first control voltage, and wherein the low-side transistor includes a second control terminal configured to receive a second control voltage conduct the load current flowing in a negative flow direction based on the second control voltage; a first overcurrent monitoring circuit configured to compare a first measurement signal that is representative of the load current flowing in the positive flow direction to a first comparator threshold that corresponds to a first overcurrent threshold, generate a first fault signal in response to the first measurement signal exceeding the first comparator threshold for a first time interval, and generate a second fault signal in response to the first measurement signal exceeding the first comparator threshold for a second time interval, wherein the second time interval is greater than the first time interval; a second overcurrent monitoring circuit configured to compare a second measurement signal that is representative of the load current flowing in the negative flow direction to a second comparator threshold that corresponds to a second overcurrent threshold, generate a third fault signal in response to the second measurement signal exceeding the second comparator threshold for a third time interval, and generate a fourth fault signal in response to the second measurement signal exceeding the second comparator threshold for a fourth time interval, wherein the fourth time interval is greater than the second time interval; a gate driver circuit coupled to the first control terminal and the second control terminal, the gate driver circuit configured to regulate the first control voltage to drive the high-side transistor between switching states to control the load current and regulate the second control voltage to drive the low-side transistor between switching states to control the load current, wherein the gate driver circuit is configured to regulate the first control voltage to turn off the high-side transistor in response to the overcurrent monitoring circuit generating the second fault signal and regulate the second control voltage to turn off the low-side transistor in response to the overcurrent monitoring circuit generating the fourth fault signal; and a current limiting circuit connected to the first control terminal and the second control terminal, wherein, in response to the overcurrent monitoring circuit generating the first fault signal, the current limiting circuit is configured to adjust the first control voltage to a first adjusted voltage level in order to limit the load current to a first reduced current level that is preconfigured to be greater than the first overcurrent threshold, wherein the first adjusted voltage level is sufficient to maintain the high-side transistor in an on-state, and wherein, in response to the overcurrent monitoring circuit generating the third fault signal, the current limiting circuit is configured to adjust the second control voltage to a second adjusted voltage level in order to limit the load current to a second reduced current level that is preconfigured to be greater than the second overcurrent threshold, wherein the second adjusted voltage level is sufficient to maintain the low-side transistor in an on-state.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies, power modules, and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value. Accordingly, the load current path of a transistor is a gate-controlled conductive channel whose conductivity is controlled by the gate voltage of the transistor.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process of an n-channel transistor, a gate driver integrated circuit (IC) may be used to provide (source) a gate current (i.e., an ON current) to the gate of the power transistor in order to charge the gate to a sufficient voltage to turn on the device. In contrast, during the turn-off process of an n-channel transistor, the gate driver IC is used to draw (sink) a gate current (i.e., an off current) from the gate of the power transistor in order to discharge the gate voltage sufficiently to turn off the device. A voltage pulse may be output from the gate driver IC as the control signal according to a pulse width modulation (PWM) scheme. Thus, the control signal may be switched between an ON voltage level and an OFF voltage level during a PWM cycle for controlling the power transistor. This in turn charges and discharges the gate voltage to turn on and off the power transistor, respectively.

The opposite is true for a p-channel transistor. The gate driver IC may be used to draw (sink) a gate current (i.e., an ON current) from the gate of the power transistor in order to discharge the gate to a sufficient voltage to turn on the device. In contrast, during the turn-off process of a p-channel transistor, the gate driver IC is used to provide (source) a gate current (i.e., an off current) to the gate of the power transistor in order to charge the gate voltage sufficiently to turn off the device. The control signal may be switched between an ON voltage level and an OFF voltage level during a PWM cycle for controlling the power transistor. This in turn charges and discharges the gate voltage to turn on and off the power transistor, respectively.

For both n-channel and p-channel transistors, the transistor is off when the gate-source voltage Vgs is 0V or below a threshold voltage and the transistor is on when the gate-source voltage Vgs is equal to or greater than the threshold voltage.

For driving a load in this manner, two power transistors are typically arranged in a half-bridge configuration. The high-side power transistor may be a p-channel transistor connected to a high voltage bus or high supply potential and the low-side power transistor may be an n-channel resistor connected to a low voltage bus or low supply potential. In more complicated designs, the high-side power transistor and the low-side transistor may be of the same transistor type (e.g., both n-channel type). Both types of half-bridges are conceivable.

A load current is said to be a positive load current when it is flowing towards the load and a load current is said to be negative when it is flowing away from the load. A high-side power transistor, when on, is responsible for conducting a positive load current in order to source the load current to the load while its complementary power transistor is turned off (i.e., the low-side power transistor is in blocking or high impedance mode). In order to sink load current from the load, the roles of the two transistors are reversed. Here, the low-side power transistor, when on, is responsible for conducting a negative load current in order to sink the load current from the load while its complementary power transistor is turned off (i.e., the high-side power transistor is in blocking or high impedance mode). The two power transistors are typically switched such that both are not turned on at the same time. Specific embodiments described in this specification pertain to, without being limited thereto, power semiconductor devices that may be used within a power converter or a power supply. Half-bridges may be used for driving electric motors or switched mode power supplies.

Transistors may include Insulated Gate Bipolar Transistors (IGBTs) and Metal Oxide Semiconductor Field Effect Transistors (MOSFETs) (e.g., Si MOSFETs or SiC MOSFETs), but are not limited thereto. It will be appreciated that MOSFETs may be substituted for IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage VDS may be substituted for the IGBT's collector-emitter voltage VCE in any one of the examples described herein. Thus, any IGBT transistor or other transistor type may be substituted by a MOSFET transistor and vice versa.

Figure 1A:
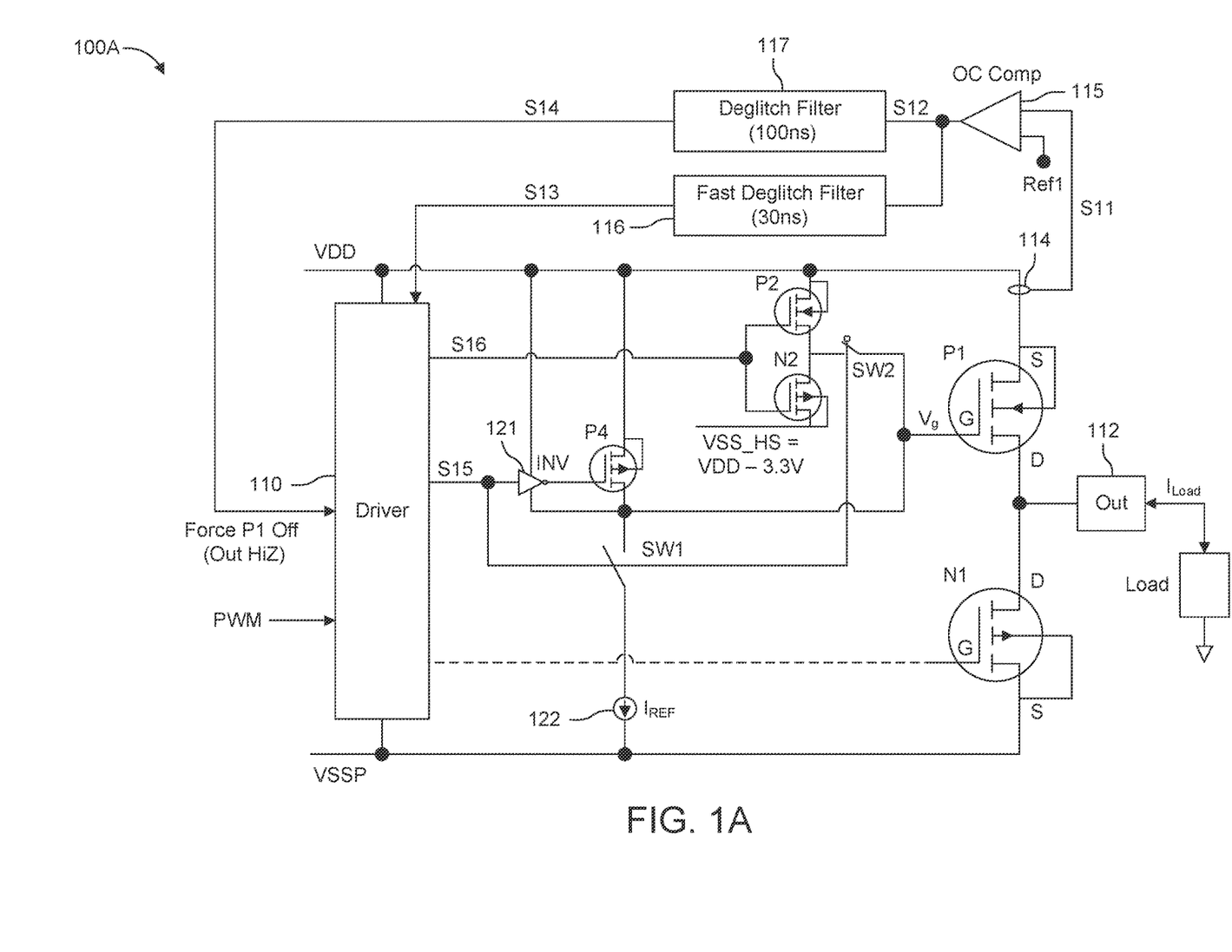
FIG. 1A is a schematic block diagram of a driver system for driving a high-side power transistor according to one or more embodiments.
Figure 1B:
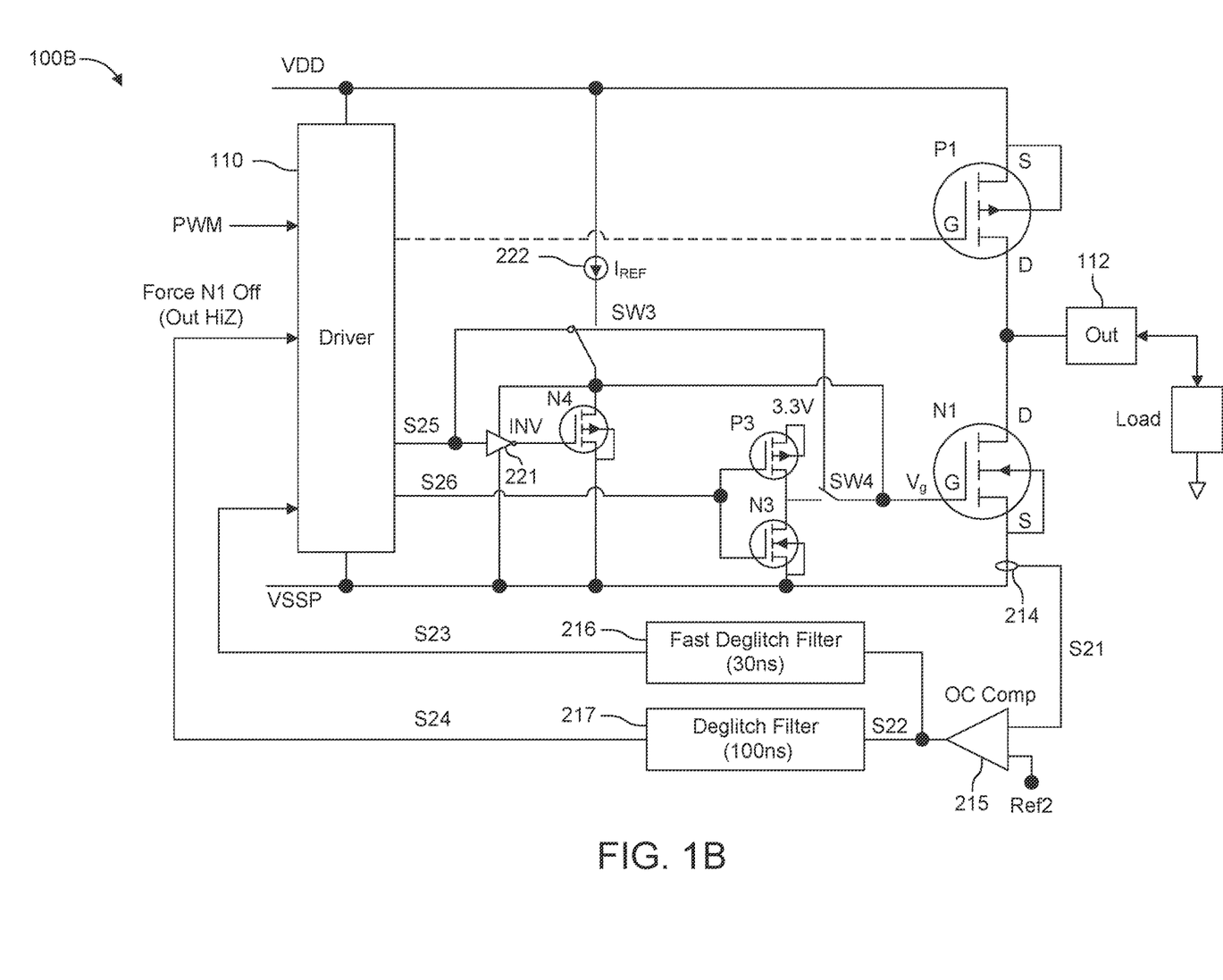
FIG. 1B is a schematic block diagram of a driver system for driving a low-side power transistor according to one or more embodiments.

FIG. 1A is a schematic block diagram of a driver system 100A for driving a high-side power transistor according to one or more embodiments. FIG. 1B is a schematic block diagram of a driver system 100B for driving a low-side power transistor according to one or more embodiments. Driver systems 100A and 100B share similarities in that they are used to drive respective power transistors P1 and N1 arranged in a half-bridge configuration. For simplicity, driver circuitry for driving a high-side power transistor P1 is shown in FIG. 1A and driver circuitry for the driving a low-side power transistor N1 is shown in FIG. 1B. However, it will be understood that the driver circuitries can be combined to drive the half-bridge for regulating positive and negative load currents Iload.

The driver system 100A includes a half-bridge of two MOSFETs that includes a high-side power transistor P1 and a low-side power transistor N1. The driver system 100A also includes a driver 110 electrically coupled to the gate of power transistor P1 via buffer circuitry (e.g., a pair of complementary FETs P2 and N2 used to generate turn-on currents or voltages and turn-off currents or voltages for transistor P1). The driver 110 includes control logic for receiving one or more signals and controlling the buffer circuitry via control signal S16 based on the received signals. For example, because FETs P2 and N2 are opposite transistor types, they can be controlled in a complementary manner by a single control signal S16 that is driven high or low.

The transistors P1 and N1 are connected to an output node 112 of the half-bridge that is connected to a load. The voltage at the output node 112 is equal to the input voltage VDD when the high-side transistor P1 is on (and the low-side transistor N1 is off) and is equal to a ground potential VSSP or a negative power supply rail potential when the low-side transistor N1 is on (and the high-side transistor P1 is off). This generally results in a positive load current Iload when P1 is on and N1 is off and a negative load current Iload when N1 is on and P1 is off.

A switch SW2 is coupled to and between the output of the buffer circuitry P2, N2 and the gate of transistor P1. To be described in more detail below, the switch SW2 is controlled by the control logic of the driver 110 to either electrically connect the buffer circuitry P2, N2 to the gate of transistor P1 or disconnect the buffer circuitry P2, N2 from the gate of transistor P1. It will also be appreciated that the buffer circuitry P2, N2 may be integrated within the driver 110.

When transistor P2 is on and transistor N2 is off, the gate of transistor P1 is pulled high to the high-level power supply VDD (i.e., the gate voltage Vg=VDD). As a result, the gate-source voltage Vgs of P1 is 0V and P1 is off. Vice versa, when transistor P2 is off and transistor N2 is on, the gate of transistor P1 is pulled low to a floating ground potential VSS, which is typically 3.3V lower than VDD, which is sufficient to turn on transistor P1. In other words, the gate-source voltage Vgs of P1 is 3.3V and P1 is on. The driver 110 may receive at least one PWM control signal and to generate driving signals for the buffer circuitry for controlling the switching states of both the high-side transistor P1 and low-side transistor N1.

The driver 110 is also shown in FIG. 1B. In FIG. 1B, the driver 110 is electrically coupled to the gate of power transistor N1 via buffer circuitry (e.g., a pair of complementary FETs P3 and N3 used to generate turn-on currents or voltages and turn-off currents or voltages for transistor N1). The source of transistor P3 is coupled to a 3.3V supply (e.g., 3.3V higher than VSSP), which is sufficient to turn on transistor N1. The driver 110 includes control logic for receiving one or more signals and controlling the buffer circuitry via control signal S26 based on the received signals. For example, because FETs P3 and N3 are opposite transistor types, they can be controlled in a complementary manner by a single control signal S26 that is driven high or low.

A switch SW4 is coupled to and between the output of the buffer circuitry P3, N3 and the gate of transistor N1. To be described in more detail below, switch SW4 is controlled by the control logic of the driver 110 to either electrically connect the buffer circuitry P3, N3 to the gate of transistor N1 or disconnect the buffer circuitry P3, N3 from the gate of transistor N1. It will also be appreciated that the buffer circuitry P3, N3 may be integrated within the driver 110.

When transistor P3 is on and transistor N3 is off, the gate of transistor N1 is pulled high to the low-side power supply 3.3V (i.e., the gate voltage Vg=3.3V). As a result, the gate-source voltage Vgs of N1 is 3.3V-VSSP, where VSSP is a ground supply, and N1 is on. Vice versa, when transistor P3 is off and transistor N3 is on, the gate of transistor N1 is pulled low to the ground potential VSSP, which is sufficient to turn off transistor N1. In other words, the gate-source voltage Vgs of N1 is 0V and N1 is off. The driver 110 may receive at least one PWM control signal and to generate driving signals for the buffer circuitry for controlling the switching states of both power transistors P1 and N1.

Turning back to FIG. 1A, the driver system 100A includes a current sensor 114 that is configured to measure the load current Iload flowing through transistor P1 and generate a measurement signal S11 that has a value that is representative of the value of the load current Iload. The current sensor 114 may include a shunt resistor, a magnetic sensor, or any other circuitry capable of measuring current. The measurement signal S11 is provided to an input of an overcurrent (OC) comparator 115 that compares the measurement signal S11 to a comparator threshold Ref1 that corresponds to an overcurrent threshold. The comparator threshold Ref1 may be equal to the overcurrent threshold or proportional thereto depending on the type of current sensor 114 used.

The OC comparator 115 is configured to generate an output signal S12 depending on the comparison result. The output signal S12 may be generated as an overcurrent detection signal when the measurement signal S11 exceeds (e.g., is greater than) the comparator threshold Ref1, indicating that a possible overcurrent event has occurred. Alternatively, the output signal S12 may be a "no fault" signal when the measurement signal S11 is equal to or less than the comparator threshold Ref1. For example, the output signal S12 may be logic low when the measurement signal S11 is equal to or less than the comparator threshold Ref1 when there is no overcurrent event and thus corresponding to a "no fault" signal. Alternatively, the output signal S12 may be logic high when the measurement signal S11 is greater than the comparator threshold Ref1, thus corresponding to an overcurrent detection signal.

The output of the OC comparator 115 is coupled to a fast deglitch filter 116 and a slow deglitch filter 117. Both deglitch filters track how long the output signal S12 remains high (i.e., how long the overcurrent detection signal is generated) and compares that duration with a respective time interval. The deglitch filters may use a counter or other clock function to track the duration that the overcurrent detection signal is generated (i.e., the duration that S12 remains high). In particular, the fast deglitch filter 116 is preconfigured with a first time interval and the slow deglitch filter 117 is preconfigured with a second time interval that is greater than the first time interval. In this example, the first time interval is 30 ns and the second interval is 100 ns but are not limited thereto. The time intervals are set to be long enough to avoid false detections of an overcurrent event. If at any point the output signal S12 goes low, indicating no fault, the counter at each of the deglitch filters is reset.

The fast deglitch filter 116 is configured to receive the overcurrent detection signal and generate the first fault signal S13 on a condition that the fast deglitch filter 116 receives the overcurrent detection signal for an entire duration of the first time interval. That is, if the counter value of the fast deglitch filter 116 reaches the first time interval, the fast deglitch filter 116 generates the first fault signal S13. Signal S13 is toggled between low and high values depending on if a fault is detected (e.g., low=no fault; high=fault).

Likewise, the slow deglitch filter 117 is configured to receive the overcurrent detection signal and generate the second fault signal S14 on a condition that the slow deglitch filter 117 receives the overcurrent detection signal for an entire duration of the second time interval. That is, if the counter value of the slow deglitch filter 117 reaches the second time interval, the slow deglitch filter 117 generates the second fault signal S14. Signal S14 is toggled between low and high values depending on if a fault is detected (e.g., low=no fault; high=fault).

In this way, the current sensor 114, the OC comparator 115, the fast deglitch filter 116, and the slow deglitch filter 117 form an overcurrent monitoring circuit used for detecting overcurrents in the load current Iload and for signaling faults to the driver 110.

The driver 110 is coupled to the control (gate) terminal of the transistor P1 and is configured to regulate the control voltage Vgs to drive the transistor P1 between switching states to control the load current. The control voltage Vgs is adjusted by controlling the voltage at the gate Vg.

In order to protect transistor P1, the driver 110 is configured to regulate the control voltage Vg to turn off the transistor P1 in response to the overcurrent monitoring circuit generating the second fault signal S14. When transistor P1 is turned off due to an overcurrent detected by the slow deglitch filter 117, the output node 112 is placed in a high impedance state since transistor N1 is also in an off state.

The driver system 100A further includes a current limiting circuit connected to the control terminal (gate) of the transistor P1. The current limiting circuit is activated in response to the fast deglitch filter 116 generating the first fault signal S13, which naturally occurs before any second fault signal S14 can be generated due to the difference in configured deglitch time intervals (e.g., 30 ns versus 100 ns). In response to receiving the first fault signal S13 that indicates that the first time interval has been met, the current limiting circuit is configured to adjust the control voltage Vgs to an adjusted voltage level in order to limit the load current Iload to a reduced current level that is preconfigured to be greater than the overcurrent threshold, wherein the adjusted voltage level is sufficient to maintain the power transistor P1 in an on-state.

In other words, the control voltage Vgs is adjusted to a level that still causes the output signal S12 to signal an overcurrent detection (i.e., to remain high due to S11 being maintained to be greater than Ref1), which requires Vgs to remain at or above the threshold voltage of transistor P1. Specifically, the control voltage Vgs must remain at a level that is sufficient to allow enough load current to flow through P1 that ensures that the measurement signal S11 still exceeds Ref1. The goal here is to limit the load current to an acceptable level without interrupting the counter of the slow deglitch filter 117 during an on-going overcurrent condition in the load current Iload. By doing so, the load current flowing through the transistor P1 is limited to a current level that is acceptable for the transistor P1 to be turned off from that will not cause damage to the transistor that would have resulted if the transistor was turned off while the load current was above its maximum switching current capacity.

The current limiting circuit includes the driver 110 that includes logic that receives the two fault signals S13 and S14, two switches SW1 and SW2 that are operating in a complementary manner via the control logic of the driver 110, an inverter 121, a diode-connected transistor P4 that is diode-connected (i.e., the transistor's gate is coupled or shorted to the transistor's drain to form an active diode), and a current source 122.

The fast deglitch filter 116 is used to avoid unwanted activation of the current limit during normal P1 turn ON. When the driver 110 receives the first fault signal S13 indicating that the first time interval has been met by S12, the driver 110 controls switch SW1 to close and switch SW2 via control signal S15 to open to activate the current limiting circuit. Additionally, this switching function causes the buffer circuit P2, N2 to be disconnected from the gate of transistor P1. Additionally, the control signal S15 is coupled to the input of inverter 121, which activates (i.e., turns on) the diode-connected transistor P4 as a diode. Additionally, by closing switch SW1, the current source 122 is now connected to the drain of the diode-connected transistor P4, which completes the current limiting circuit.

The inverter 121 may be referred to as a gate driver having a CMOS output stage like an inverter. It brings its output to low when its input goes high. Bringing its output to low means short circuiting the gate of transistor P4 with the gate of transistor P1. This creates a current mirror just in case the short circuit condition is detected.

When switch SW1 is closed and switch SW2 is open, the diode-connected transistor P4 and the power transistor P1 form a current mirror, with the magnitude of the load current Iload flowing through P1 being dependent on and limited by the magnitude of the mirror current Iref of the current source 122 and the dimension size ratio of P4 and P1. The reduced current level of the load current Iload is proportional to the mirror current Iref based on the dimension size ratio of P4 and P1.

Specifically, the driver 110 may toggle the control signal S15 between logic high and logic low states. When the control signal S15 is low (i.e., current limiting circuit disabled), switch SW1 is open and switch SW2 is closed and transistor P1 continues to be controlled by the primary control loop through its buffer circuit P2, N2. When the control signal S15 is set high in response to the fault signal S13 being received indicating that the first time interval has been met by S12, switch SW1 is closed and switch SW2 is open and the load current Iload flowing through transistor P1 is limited by the current mirror formed by the current limiting circuit. Here, the output of the inverter 121 goes low to turn on the diode-connected transistor P4. During this "current mirror" configuration, the power dissipation inside P1 is greatly increased, however it lasts only around 70 ns (i.e., the difference between the first and the second time intervals) and is tolerable.

The current limiting circuit is configured to align the control voltage Vgs with the adjusted voltage level in order to limit the load current to the reduced current level, where the adjusted voltage level is a preconfigured voltage level set by the current mirror and the reduced current level is a preconfigured current level set by the mirror current Iref and the ratio of the size dimensions of transistors P1 and P4. Adjusting the control voltage Vgs transitions the transistor P1 from being fully saturated (i.e., fully on) to only partially on, which restricts the amount of current that can flow through the transistor P1. This current limiting function is preformed prior to the driver 110 turning off the power transistor P1 in response to the overcurrent monitoring circuit generating the second fault signal S14.

For a p-channel type transistor, the current limiting circuit is configured to increase the control voltage to the adjusted voltage level in order to limit the load current to the reduced current level. A noted above, transistor P1 includes a load path terminal (i.e., source terminal) coupled to a high supply potential VDD, and the control voltage Vgs is increased to reduce a difference between the gate voltage Vg and the high supply potential VDD to limit the load current flowing through the transistor P1.

For an n-channel type transistor, the current limiting circuit is configured to decrease the control voltage Vgs to the adjusted voltage level in order to limit the load current to the reduced current level. As will be explained in reference to FIG. 1B and transistor N1, transistor N1 includes a load path terminal (e.g., source terminal) coupled to a low supply potential VSSP, and its control voltage Vgs is decreased to reduce a difference between the gate voltage Vg and the low supply potential VSSP.

The slow deglitch filter 117 is used to turn off the power transistor P1 in response to the second time interval being met by the output signal S12 (e.g., when S12 remains high for the entire 100 ns duration). The driver 110 receives the second fault signal S14 indicating that the second time interval has been met by S12 and prepares the control circuitry for turning off transistor P1. By this time, the load current Iload flowing through transistor P1 has been limited to the reduced current level that is acceptable for transistor turn off. Thus, in response to receiving the second fault signal S14, the driver 110 reverses the switching states of the switches SW1 and SW2 such that switch SW1 is open and switch SW2 is closed by driving control signal S15 low. Setting control signal S15 low also causes the output of inverter 121 to go high, thereby turning off the diode-connected transistor P4. The result is that the current limiting circuit is disabled, transistor P1 is no longer in a current mirror with diode-connected transistor P4, and buffer circuit P2, N2 is again connected to the gate of transistor P1. Once switch SW1 is open and switch SW2 is closed, the driver 110 controls the buffer circuit P2, N2 to turn off the transistor P1 (i.e., P2 is on and N2 is off). With transistor N1 also turned off, the output node 112 is set into a high-impedance state to protect the drive system 100A from damage.

Turning to FIG. 1B, driver system 100B is similar to driver system 100A, with the exception that it is configured to drive the low-side transistor N1 and limit the negative load current Iload flowing therethough prior to complete turn off in the event of an overcurrent event. The driver 110 performs the same functions described above.

The driver system 100B includes a current sensor 214 similar to current sensor 114. The current sensor 214 generates a measurement signal S21 that is representative of the load current flowing through power transistor N1. The measurement signal S21 is provided to an input of an OC comparator 215 that compares the measurement signal S21 to a comparator threshold Ref2 that corresponds to an overcurrent threshold. The comparator threshold Ref2 may be equal to the overcurrent threshold or proportional thereto depending on the type of current sensor 115 used.

The OC comparator 215 is similar to OC comparator 115; it is configured to generate an output signal S22 depending on the comparison result. The output signal S22 may be generated as an overcurrent detection signal when the measurement signal S21 exceeds (e.g., is greater than) the comparator threshold Ref2, indicating that a possible overcurrent event has occurred. Alternatively, the output signal S22 may be a "no fault" signal when the measurement signal S21 is equal to or less than the comparator threshold Ref2.

The output of the OC comparator 215 is coupled to a fast deglitch filter 216 and a slow deglitch filter 217, which are equivalent to deglitch filters 116 and 117, respectively. The fast deglitch filter 216 is configured to receive the overcurrent detection signal S22 and generate the first fault signal S23 on a condition that the fast deglitch filter 216 receives the overcurrent detection signal for an entire duration of the first time interval. Likewise, the slow deglitch filter 217 is configured to receive the overcurrent detection signal S22 and generate the second fault signal S24 on a condition that the slow deglitch filter 217 receives the overcurrent detection signal for an entire duration of the second time interval. In this way, the current sensor 214, the OC comparator 215, the fast deglitch filter 216, and the slow deglitch filter 217 form an overcurrent monitoring circuit used for detecting overcurrents in the load current Iload and for signaling faults to the driver 110.

The first fault signal S23 triggers actions performed by the driver 110 in a similar way as described above with respect to the first fault signal S13. Also, the second fault signal S24 triggers actions performed by the driver 110 in a similar way as described above with respect to the second fault signal S14. To this point, switch SW3 is equivalent to switch SW1, switch SW4 is equivalent to switch SW2, inverter 221 is equivalent to inverter 121, diode-connected transistor N4 is equivalent to diode-connected transistor P4, current source 222 is equivalent to current source 122, and control signal S25 is equivalent to control signal S15 for performing current limiting functions and turn off functions with respect to power transistor N1. The functions and operations of each of these components are equivalent as those described above, with the exception that their operation states depend on measurement signal 21 instead of measurement signal 11 in order to control the load current Iload flowing through transistor N1.

In response to receiving the first fault signal S23 that indicates that the first time interval has been met by S22, the current limiting circuit is configured to adjust the control voltage Vgs of N1 to an adjusted voltage level in order to limit the load current Iload to a reduced current level that is preconfigured to be greater than the overcurrent threshold, wherein the adjusted voltage level is sufficient to maintain the power transistor N1 in an on-state.

In other words, the control voltage Vgs is adjusted to a level that still causes the output signal S22 to signal an overcurrent detection (i.e., to remain high due to S21 being maintained to be greater than Ref2), which requires Vgs to remain at or above the threshold voltage of transistor N1. Specifically, the control voltage Vgs must remain at a level that is sufficient to allow enough load current to flow through N1 that ensures that the measurement signal S21 still exceeds Ref2. The goal here is to limit the load current to an acceptable level without interrupting the counter of the slow deglitch filter 217 during an on-going overcurrent condition in the load current Iload. By doing so, the load current flowing the transistor N1 is limited to a current level that is acceptable for the transistor N1 to be turned off from that will not cause damage to the transistor that would have resulted if the transistor was turned off while the load current was above its maximum switching current capacity.

When the control signal S25 is set low in response to the fault signal S23 being received indicating that the first time interval has been met by S22, switch SW3 is closed and switch SW4 is open and the load current Iload flowing through transistor N1 is limited by the current mirror formed by the current limiting circuit, with mirror current Iref now flowing through transistor N4 acting as a limiting current. Here, the output of the inverter 221 goes high to turn on the diode-connected transistor N4. During this "current mirror" configuration, the power dissipation inside N1 is greatly increased, however it lasts only around 70 ns (i.e., the difference between the first and the second time intervals) and is tolerable.

The current limiting circuit is configured to align the control voltage Vgs of N1 with the adjusted voltage level in order to limit the load current to the reduced current level, where the adjusted voltage level is a preconfigured voltage level set by the current mirror and the reduced current level is a preconfigured current level set by the mirror current Iref and the ratio of the size dimensions of transistors N1 and N4. Adjusting the control voltage Vgs transitions the transistor N1 from being fully saturated (i.e., fully on) to only partially on, which restricts the amount of current that can flow through the transistor N1. This current limiting function is preformed prior to the driver 110 turning off the power transistor N1 in response to the overcurrent monitoring circuit generating the second fault signal S24.

In response to receiving the second fault signal S24, the driver 110 reverses the switching states of the switches SW3 and SW4 such that switch SW3 is open and switch SW4 is closed by driving control signal S25 high. Setting control signal S25 high also causes the output of inverter 221 to go low, thereby turning off the diode-connected transistor N4. The result is that the current limiting circuit is disabled, transistor N1 is no longer in a current mirror with diode-connected transistor N4, and buffer circuit P3, N3 is again connected to the gate of transistor N1. Once switch SW3 is open and switch SW4 is closed, the driver 110 controls the buffer circuit P3, N3 to turn off the transistor N1 (i.e., N3 is on and P3 is off). With transistor P1 also turned off, the output node 112 is set into a high-impedance state to protect the drive system 100B from damage.

As noted above, drive systems 110A and 110B can be combined for driving both power transistors P1 and N1 in a single integrated circuit. The embodiments are directed to using full power (lowest on resistance Ron) for the conducting power transistor most of the time and to limit the load current to a level slightly above the overcurrent threshold, if and only if overcurrent is detected and validated by a fast deglitch filter, in such a way that the subsequent turn off of the power transistor happens at a limited/controlled current level.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A driver system configured to drive a load, the driver system comprising:
    a power transistor including a control terminal, the power transistor is configured to receive a control voltage at the control terminal and conduct a load current based on the control voltage;
    an overcurrent monitoring circuit configured to compare a measurement signal that is representative of the load current to a comparator threshold that corresponds to an overcurrent threshold, generate a first fault signal in response to the measurement signal exceeding the comparator threshold for a first time interval, and generate a second fault signal in response to the measurement signal exceeding the comparator threshold for a second time interval, wherein the second time interval is greater than the first time interval;

a gate driver circuit coupled to the control terminal, the gate driver circuit configured to regulate the control voltage to drive the power transistor between switching states to control the load current, wherein the gate driver circuit is configured to regulate the control voltage to turn off the power transistor in response to the overcurrent monitoring circuit generating the second fault signal; and a current limiting circuit connected to the control terminal of the power transistor, wherein, in response to the overcurrent monitoring circuit generating the first fault signal, the current limiting circuit is configured to adjust the control voltage to an adjusted voltage level in order to limit the load current to a reduced current level that is preconfigured to be greater than the overcurrent threshold, wherein the adjusted voltage level is sufficient to maintain the power transistor in an on-state.

2. The driver system of claim 1, wherein the current limiting circuit is configured to align the control voltage with the adjusted voltage level in order to limit the load current to the reduced current level, wherein the adjusted voltage level is a preconfigured voltage level and the reduced current level is a preconfigured current level.

3. The driver system of claim 2, wherein the control terminal is a gate terminal and the control voltage is a gate-source voltage or the control terminal is a base terminal and the control voltage is a base-emitter voltage.

4. The driver system of claim 1, wherein the current limiting circuit is configured to align the control voltage with the adjusted voltage level prior to the gate driver circuit turning off the power transistor in response to the overcurrent monitoring circuit generating the second fault signal.

5. The driver system of claim 1, wherein the power transistor is a p-channel type transistor, and
in response to the overcurrent monitoring circuit generating the first fault signal, the current limiting circuit is configured to increase the control voltage to the adjusted voltage level in order to limit the load current to the reduced current level.

6. The driver system of claim 5, wherein power transistor comprises a load path terminal coupled to a high supply potential, and the control voltage is increased to reduce a difference between a gate potential of the power transistor and the high supply potential.

7. The driver system of claim 1, wherein the power transistor is an n-channel type transistor, and
in response to the overcurrent monitoring circuit generating the first fault signal, the current limiting circuit is configured to decrease the control voltage to the adjusted voltage level in order to limit the load current to the reduced current level.

8. The driver system of claim 7, wherein power transistor comprises a load path terminal coupled to a low supply potential, and the control voltage is decreased to reduce a difference between a gate potential of the power transistor and the low supply potential.

9. The driver system of claim 1, wherein:
the current limiting circuit comprises a current mirror circuit comprising a diode-connected transistor, the power transistor, and a first switch,
the diode-connected transistor and the power transistor are connected in a current mirror configuration,
the first switch is configured to enable the current mirror circuit when closed and disable the current mirror circuit when open, and
the first switch is configured to close, thereby enabling the current mirror circuit, in response to the overcurrent monitoring circuit generating the first fault signal.

10. The driver system of claim 9, wherein the current mirror circuit further comprises a current source configured to generate a mirror current,
wherein the first switch is coupled between the diode-connected transistor and the current source, and, when the first switch is closed, the first switch causes the mirror current to flow through the diode-connected transistor and causes the load current with the reduced current level to flow through the power transistor, wherein the reduced current level is proportional to the mirror current.

11. The driver system of claim 9, wherein the diode-connected transistor is configured to turn on in response to the first fault signal indicating that the measurement signal has exceeded the comparator threshold for the first time interval.

12. The driver system of claim 9, wherein:
the gate driver circuit is coupled to the control terminal via a second switch that is configured to operate in a complementary manner to the first switch, and
the first switch is configured to close and the second switch is configured to open in response to the overcurrent monitoring circuit generating the first fault signal.

13. The driver system of claim 12, wherein, in response to the overcurrent monitoring circuit generating the second fault signal, the gate driver circuit is configured to close the second switch and open the first switch prior to regulating the control voltage for turning off the power transistor.

14. The driver system of claim 12, further comprising:
a logic circuit coupled to the overcurrent monitoring circuit and configured to receive the first fault signal and the second fault signal,
wherein the logic circuit is configured to control the first switch to close and the second switch to open in response to receiving the first fault signal and control the first switch to open and the second switch to close in response to receiving the second fault signal,
wherein the logic circuit is configured to control the gate driver circuit to regulate the control voltage to turn off the power transistor in response to receiving the second fault signal.

15. The driver system of claim 14, wherein the logic circuit is configured to control switching states of the diode-connected transistor based on the first fault signal and the second fault signal, including turning on the diode-connected transistor in response to receiving the first fault signal and turning off the diode-connected transistor in response to receiving the second fault signal.

16. The driver system of claim 14, wherein the logic circuit is integrated in the gate driver circuit.

17. The driver system of claim 9, further comprising:
a logic circuit coupled to the overcurrent monitoring circuit and configured to receive the first fault signal and the second fault signal,
wherein the logic circuit is configured to control switching states of the diode-connected transistor based on the first fault signal and the second fault signal, including turning on the diode-connected transistor in response to receiving the first fault signal and turning off the diode-connected transistor in response to receiving the second fault signal.

18. The driver system of claim 1, wherein the overcurrent monitoring circuit comprises:
   a current sensor configured to generate the measurement signal representative of the load current;
   a comparator configured to compare the measurement signal to the comparator threshold and generate an overcurrent detection signal while the measurement signal exceeds the comparator threshold;
   a first deglitch filter configured to receive the overcurrent detection signal and generate the first fault signal on a condition that the first deglitch filter receives the overcurrent detection signal for an entire duration of the first time interval; and
   a second deglitch filter configured to receive the overcurrent detection signal and generate the second fault signal on a condition that the second deglitch filter receives the overcurrent detection signal for an entire duration of the second time interval.

19. The driver system of claim 18, wherein the comparator is configured to generate a no fault signal while the measurement signal does not exceed the comparator threshold.

20. A method of driving a power transistor to drive a load, the power transistor includes a control terminal and is configured to receive a control voltage at the control terminal and conduct a load current based on the control voltage, the method comprising:
   comparing, by an overcurrent monitoring circuit, a measurement signal that is representative of the load current to a comparator threshold that corresponds to an overcurrent threshold;
   generating, by the overcurrent monitoring circuit, a first fault signal in response to the measurement signal exceeding the comparator threshold for a first time interval;
   generating, by the overcurrent monitoring circuit, a second fault signal in response to the measurement signal exceeding the comparator threshold for a second time interval, wherein the second time interval is greater than the first time interval;
   regulating, by a gate driver circuit, the control voltage to drive the power transistor between switching states to control the load current, including regulating the control voltage to turn off the power transistor in response to the overcurrent monitoring circuit generating the second fault signal; and
   in response to the overcurrent monitoring circuit generating the first fault signal, adjusting, by a current limiting circuit, the control voltage to an adjusted voltage level in order to limit the load current to a reduced current level that is preconfigured to be greater than the overcurrent threshold, wherein the adjusted voltage level is sufficient to maintain the power transistor in an on-state.

21. A driver system configured to drive a load, the driver system comprising:
   a half bridge circuit comprising a high-side transistor and a low-side transistor, wherein the high-side transistor includes a first control terminal configured to receive a first control voltage conduct a load current flowing in a positive flow direction based on the first control voltage, and wherein the low-side transistor includes a second control terminal configured to receive a second control voltage conduct the load current flowing in a negative flow direction based on the second control voltage;
   a first overcurrent monitoring circuit configured to compare a first measurement signal that is representative of the load current flowing in the positive flow direction to a first comparator threshold that corresponds to a first overcurrent threshold, generate a first fault signal in response to the first measurement signal exceeding the first comparator threshold for a first time interval, and generate a second fault signal in response to the first measurement signal exceeding the first comparator threshold for a second time interval, wherein the second time interval is greater than the first time interval;
   a second overcurrent monitoring circuit configured to compare a second measurement signal that is representative of the load current flowing in the negative flow direction to a second comparator threshold that corresponds to a second overcurrent threshold, generate a third fault signal in response to the second measurement signal exceeding the second comparator threshold for a third time interval, and generate a fourth fault signal in response to the second measurement signal exceeding the second comparator threshold for a fourth time interval, wherein the fourth time interval is greater than the second time interval;
   a gate driver circuit coupled to the first control terminal and the second control terminal, the gate driver circuit configured to regulate the first control voltage to drive the high-side transistor between switching states to control the load current and regulate the second control voltage to drive the low-side transistor between switching states to control the load current, wherein the gate driver circuit is configured to regulate the first control voltage to turn off the high-side transistor in response to the first overcurrent monitoring circuit generating the second fault signal and regulate the second control voltage to turn off the low-side transistor in response to the second overcurrent monitoring circuit generating the fourth fault signal; and
   a current limiting circuit connected to the first control terminal and the second control terminal,
   wherein, in response to the first overcurrent monitoring circuit generating the first fault signal, the current limiting circuit is configured to adjust the first control voltage to a first adjusted voltage level in order to limit the load current to a first reduced current level that is preconfigured to be greater than the first overcurrent threshold, wherein the first adjusted voltage level is sufficient to maintain the high-side transistor in an on-state, and
   wherein, in response to the second overcurrent monitoring circuit generating the third fault signal, the current limiting circuit is configured to adjust the second control voltage to a second adjusted voltage level in order to limit the load current to a second reduced current level that is preconfigured to be greater than the second overcurrent threshold, wherein the second adjusted voltage level is sufficient to maintain the low-side transistor in an on-state.

* * * * *